US006885138B1

(12) United States Patent
Yoo

(10) Patent No.: US 6,885,138 B1
(45) Date of Patent: Apr. 26, 2005

(54) FERROELECTRIC EMITTER

(75) Inventor: In-Kyeong Yoo, Yongin (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 904 days.

(21) Appl. No.: 09/665,122

(22) Filed: Sep. 20, 2000

(51) Int. Cl.[7] .............................. H01J 1/14; H01J 19/06
(52) U.S. Cl. .................... 313/346 R; 313/311; 313/310
(58) Field of Search ................................ 313/310, 311, 313/346 R

(56) References Cited

U.S. PATENT DOCUMENTS

| 5,031,144 | A | * | 7/1991 | Persky ........................ 365/145 |
| 5,122,477 | A | * | 6/1992 | Wolters et al. ................. 438/3 |
| 5,432,015 | A | * | 7/1995 | Wu et al. ..................... 428/690 |
| 5,508,590 | A | * | 4/1996 | Sampayan et al. ....... 315/169.1 |
| 5,747,926 | A | * | 5/1998 | Nakamoto et al. .......... 313/495 |
| 5,874,802 | A | * | 2/1999 | Choi et al. ................... 313/495 |
| 6,246,069 | B1 | * | 6/2001 | Hsu et al. ...................... 257/10 |
| 6,479,924 | B1 | * | 11/2002 | Yoo ............................. 313/310 |
| 6,635,495 | B1 | * | 10/2003 | Hashimoto et al. ............ 438/3 |

FOREIGN PATENT DOCUMENTS

JP          10-223129          8/1998

* cited by examiner

*Primary Examiner*—Joseph Williams
*Assistant Examiner*—Peter Macchiarolo
(74) *Attorney, Agent, or Firm*—Lee & Sterba, P.C.

(57) ABSTRACT

A ferroelectric multi-layered emitter used in a semiconductor lithography process includes a lower electrode, a ferroelectric layer, having a top surface with two end portions, which overlies the lower electrode, an insertion electrode formed on a region excluding the two end portions of the top surface of the ferroelectric layer, a dielectric layer, having sides and a top surface with two end portions, which has a predetermined pattern and is formed along the top surface of the ferroelectric layer and the insertion electrode, and a dummy upper electrode formed on a side of the dielectric layer opposite the ferroelectric layer. The ferroelectric emitter of the present invention guarantees uniform electron emission from wide and narrow gaps of a mask layer and in an isolated pattern such as a doughnut shape for ferroelectric switching emission lithography.

7 Claims, 5 Drawing Sheets

FERROELECTRIC EMITTER

BACKGROUND OF THE INVENTION

1. Field of the Invention

The present invention relates to a ferroelectric emitter. More specifically, the present invention relates to a ferroelectric multi-layered emitter used in a semiconductor lithography process.

2. Description of the Related Art

Ferroelectric emission by switching allows for a simple process in electron emission lithography. In the past, electron emission suitable for lithography has been obtained by switching an emitter in a magnetic field. However, a conventional ferroelectric emitter cannot guarantee electron emission where the gap between two electrodes is too wide or too narrow for switching.

For example, in the conventional ferroelectric emitter, if the gap between two electrodes is too wide an electric field cannot reach the center portion of the ferroelectric emitter. Thus a switching effect does not occur in a ferroelectric region. If, on the other hand, the gap between the two electrodes, or a gap of a mask pattern, is too narrow, then the mask pattern formed on a ferroelectric layer in a ferroelectric emitter absorbs electrons during electron emission, so that electrons flow through the patterned mask. Moreover, an isolated pattern, such as a doughnut shape, cannot be switched because the two electrodes are not connected to each other.

In contrast to ferroelectric switching, pyroelectric emission can provide a uniform emission of electrons regardless of the characteristics of a gap of a mask pattern. Pyroelectricity refers to the production of polarization changes by temperature variations. Due to such properties, when a material is subjected to a temperature change, the magnitude of a spontaneous polarization changes to affect bound charges, so that a current flows between the top and bottom electrodes.

If an emitter is heated and this process occurs in a vacuum, then bound charges, which are electrons screening on the surface of the emitter, are released in a vacuum, which is called pyroelectric emission. In this case, uniform emission is allowed regardless of a gap distance. Furthermore, pyroelectric emission enables uniform electron emission in an isolated pattern such as a doughnut pattern. Although it facilitates electron emission, pyroelectric emission has several disadvantages. One of the disadvantages is the requirement the restriction of re-poling an emitter or heating an emitter above the Curie temperature for re-emission.

SUMMARY OF THE INVENTION

A feature of the present invention is to provide a ferroelectric emitter that guarantees uniform emission of electrons from both wide and narrow gaps of a mask pattern and in an isolated pattern such as a doughnut shape for ferroelectric switching emission lithography while eliminating a need to heat an emitter above the Curie temperature for re-emission.

The present invention provides a ferroelectric emitter including: a lower electrode; a ferroelectric layer, having a top surface with two end portions, which overlies the lower electrode; an insertion electrode formed on a region excluding the two end portions of the top surface of the ferroelectric layer; a dielectric layer, having a top surface with two end portions, having a predetermined pattern and formed along the top surface of the ferroelectric layer and the insertion electrode; and a dummy upper electrode formed on one side of the dielectric layer opposite the ferroelectric layer.

In a preferred embodiment of the present invention, the predetermined pattern is formed in the top surface of the dielectric layer excluding the two end portions thereof, and the dummy upper electrode is easily separable from the dielectric layer. The dummy upper electrode is formed on a region excluding the patterned portion of the dielectric layer.

The present invention also provides a ferroelectric emitter including: a lower electrode; a ferroelectric layer, having a top surface with two end portions, which overlies the lower electrode; an insertion electrode formed on a region excluding the two end portions of the top surface of the ferroelectric layer; a first dielectric layer, having projected side edges, is formed along the top surface of the ferroelectric layer and the insertion electrode; a second dielectric layer formed along the top surface of the first dielectric layer excluding the projected side edges; and a dummy upper electrode formed on one projected side of the first dielectric layer.

In another preferred embodiment of the present invention, the dielectric constant of the first dielectric layer is higher than the dielectric constant of the second dielectric layer, and the dummy upper electrode is readily separable from the first dielectric layer.

BRIEF DESCRIPTION OF THE DRAWINGS

The above-described feature and advantages of the present invention will become more apparent by describing in detail preferred embodiments of the present invention with reference to the attached drawings in which.

DETAIL DESCRIPTION OF PREFERRED EMBODIMENTS

Figure 1:
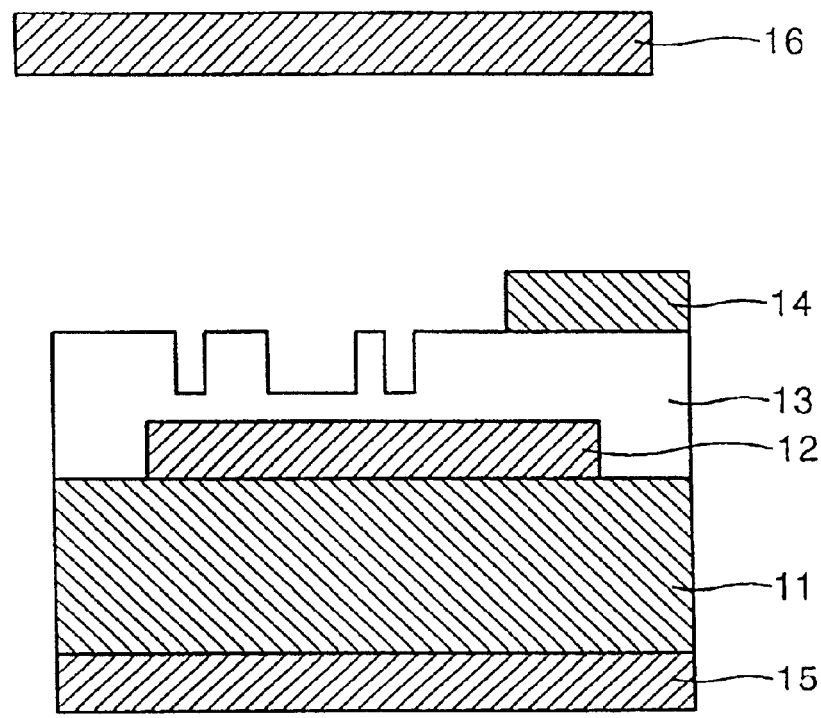
FIG. 1 is a cross-sectional view showing the structure of a ferroelectric emitter according to a preferred embodiment of present invention.

Referring to FIG. 1, a ferroelectric emitter according to a preferred embodiment of the present invention includes an insertion electrode 12 formed on a top surface of a ferroelectric layer 11. A dielectric layer 13 having a predetermined pattern is formed along the top surface of the ferroelectric layer 11 and the insertion electrode 12. The ferroelectric layer and the dielectric layer both having a top surface with two end portions. Thus, a top and two sides of the insertion electrode 12 are surrounded by the dielectric layer 13. Since the dielectric layer 13 is formed along the top surface of the ferroelectric layer 11 and the insertion electrode, a portion formed along the top surface of the ferroelectric layer 11 is thicker than a portion formed along a top surface of the insertion electrode 12. The predetermined pattern is formed at the top surface of the dielectric layer 13, over the insertion electrode 12.

A dummy upper electrode 14 is provided on the dielectric layer 13. The dummy upper electrode 14 is easily separable during the operation of the ferroelectric emitter according to the present invention. The dummy upper electrode 14 is formed along the top surface of an unpatterned portion of the dielectric layer 13. A lower electrode 15 underlies the ferroelectric layer 11, and the lower electrode 15 applies an external charge when operating the ferroelectric emitter according to the present invention. The insertion electrode 12 overlying the ferroelectric layer 11 is positioned between the lower electrode 15 and the dummy upper electrode 14. When an electric field is applied, the insertion electrode 12 serves to polarize the ferroelectric layer 11 around a center region thereof. Furthermore, the insertion electrode 12 serves to collect electrical charges between patterns of the dielectric layer 13, when separating the dummy upper electrode 14.

In FIG. 1, a collector 16 is provided outside the ferroelectric emitter according to the present invention, and electrons emitted from the dielectric layer 13 during the operation of the emitter reach the collector 16.

Figure 2A:
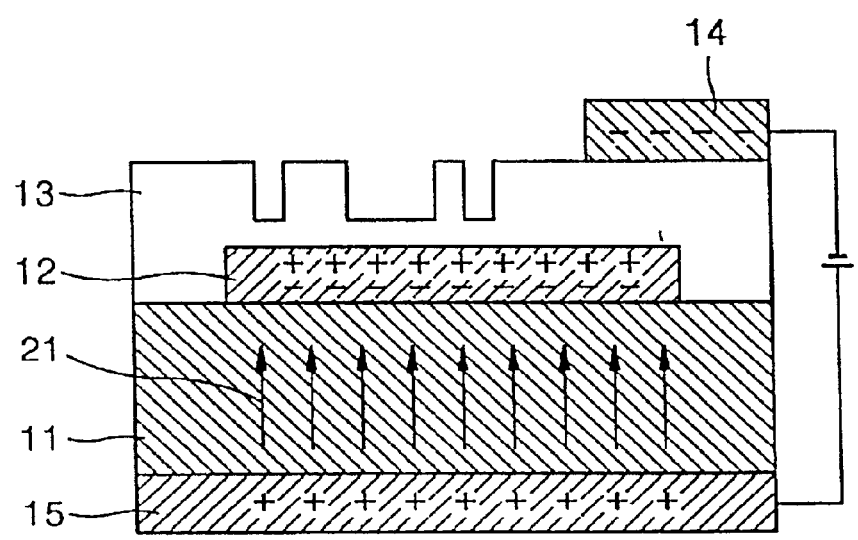
FIG. 2A is a cross-sectional view showing an initialization step in which a constant voltage is applied to the ferroelectric emitter for switching emission lithography according to the present invention, to which a dummy upper electrode is attached.

Referring now to FIG. 2A, an initialization step for electron emission will be described. First, a constant voltage is applied between the lower electrode 15 and the dummy upper electrode 14. Thus, the ferroelectric layer 11 becomes polarized 21 in order to collect positive bound charges in the lower electrode 15 and collect negative bound charges in the dummy upper electrode 14. In an initialization step, an electric field is induced between the dummy upper electrode 14 and the insertion electrode 12. An electric field is also induced between the insertion electrode 12 and the lower electrode 15. Additionally, the ferroelectric layer 11 becomes polarized within a region corresponding to the area of the insertion electrode 12.

Figure 2B:
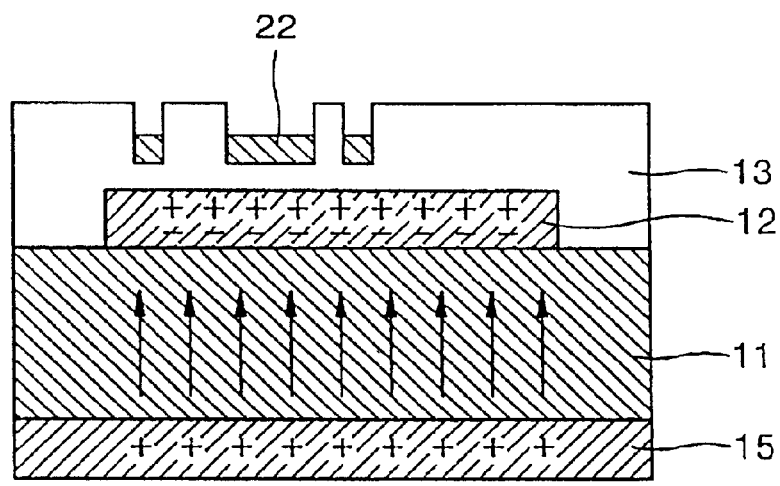
FIG. 2B Is a cross-sectional view showing a screening step in which the dummy upper electrode is separated from the ferroelectric emitter for switching emission lithography subjected to the initialization step shown in FIG. 2A.

Referring to FIG. 2B, a screening step that follows the initialization step will now be described. If the dummy upper electrode 14 formed along the top surface of the patterned dielectric layer 13 is separated from the dielectric layer 13, the negative bound charges within the dummy upper electrode 14 abruptly disappear from the emitter. To compensate for this, electrons 22 in a vacuum collect at the patterned portion of the dielectric layer 13. In this case, since more electrons are collected at a thin portion of the dielectric layer than at a thick portion thereof, electrons are collected around the center portion of the dielectric layer 13, which is patterned. As a spontaneous polarization is larger and a dielectric layer is thinner, more electrons 22 are collected.

Figure 2C:
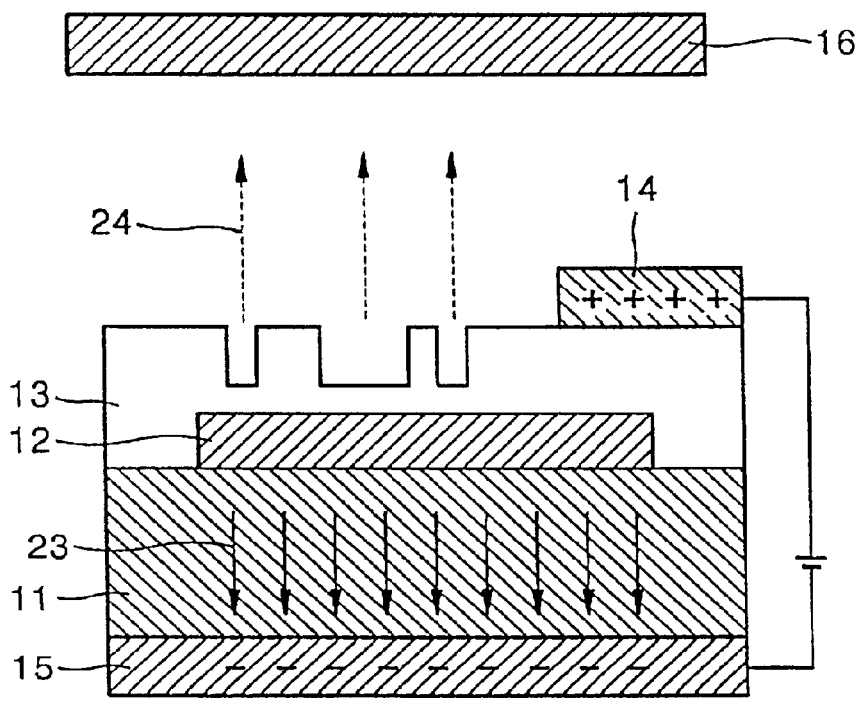
FIG. 2C is a cross-sectional view showing an emission step in which a negative voltage is applied to the ferroelectric emitter for switching emission lithography, which is subjected to the screening step shown in FIG. 2B, and to which the dummy upper electrode is attached.

An emission lithography process by switching and a pyroelectric emission lithography process are substantially the same until the screening step is performed. However, when the electron emission step is entered, the processes differ. Referring now to FIG. 2C, during an emission step for switching emission lithography, a negative voltage is applied between the dummy upper electrode 14 and the lower electrode 15, which is unlike the initialization step. Thus, positive bound charges are collected in the dummy upper electrode 14 and negative bound charges are collected in the lower electrode 15, so that polarization 23 occurs in the opposite direction to the polarization 21 produced in the initialization step. In this case, when positive charges are bound in the dummy upper electrode 14 and negative charges are bound in the lower electrode 15, electrons 24 collecting at the top surface of the dielectric layer 13 are released to move toward a collector 16. Thus, electrons 24 are emitted in this way to perform emission lithography by switching.

Figure 3A:
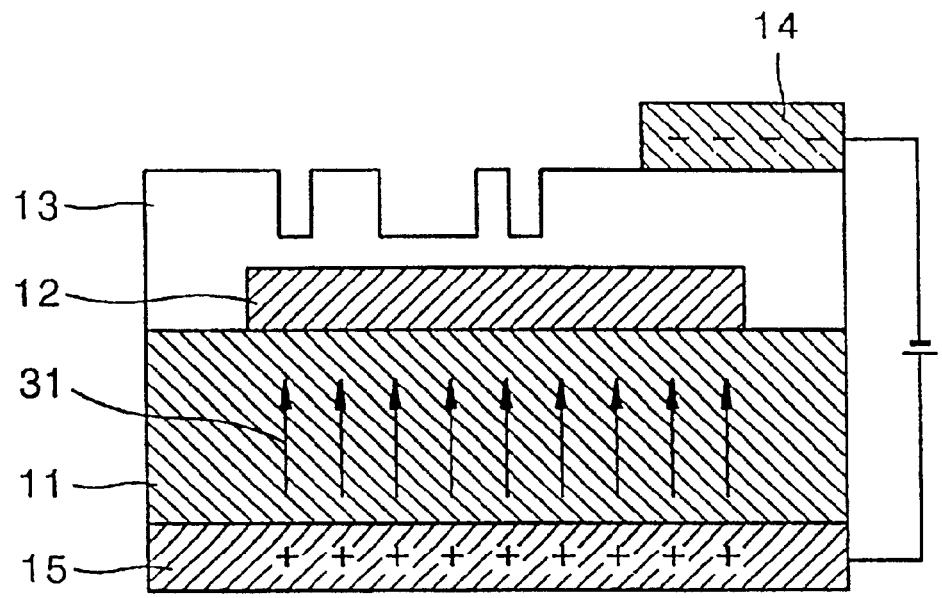
FIG. 3A is a cross-sectional view showing an initialization step in which a constant voltage is applied to a ferroelectric emitter for pyroelectric emission lithography according to the present invention, to which a dummy upper electrode is attached.

Next, referring to FIG. 3A, during an initialization step for electron emission in pyroelectric emission lithography, a constant voltage is applied between the lower electrode 15 and the dummy upper electrode 14. Put another way, in order to collect positive bound charges in the lower electrode 15 and negative bound charges in the dummy upper electrode 14, the ferroelectric layer 11 becomes polarized 31. During the initialization step, an electric field is induced between the dummy upper electrode 14 and insertion electrode 12. Another electric field is induced between the insertion electrode 12 and the lower electrode 15. Additionally, the ferroelectric layer 11 becomes polarized within a region corresponding to the area of the insertion electrode 12.

Figure 3B:
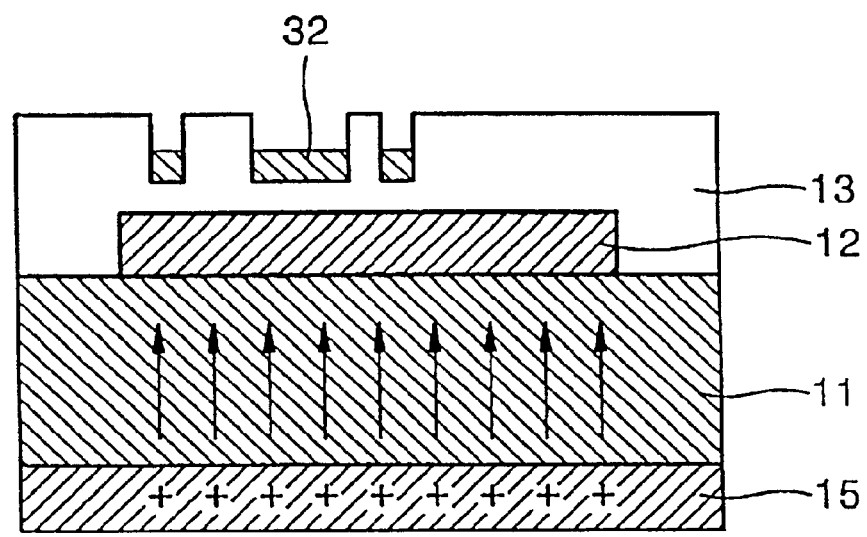
FIG. 3B is a cross-sectional view showing a screening step in which the dummy upper electrode is separated from the ferroelectric emitter for pyroelectric emission lithography subjected to the initialization step shown in FIG. 3A.

Referring to FIG. 3B, during a screening step following the initialization step, the dummy upper electrode overlying a patterned dielectric layer 13 is separated from the dielectric layer 13. In this case, due to separation of the dummy upper electrode, the negative bound charges within the dummy upper electrode abruptly disappear from the emitter. To compensate for this, electrons 32 in a vacuum collect at the patterned top surface of the dielectric layer 13. In this case, since more electrons collect at a thin portion of the dielectric layer 13 than at a thick portion thereof, electrons gather together around a center portion that is patterned. As the magnitude of spontaneous polarization is larger and a dielectric layer is thinner, more electrons 32 are collected. A pyroelectric emission lithography process proceeds in the same manner as the emission lithography process by switching in the initialization and the screening steps, but the two methods differ in an emission step. The emission lithography technique by switching adopts a way of applying a negative voltage, unlike the initialization step, while a pyroelectric emission lithography technique adopts a way of applying heat to the ferroelectric emitter.

Figure 3C:
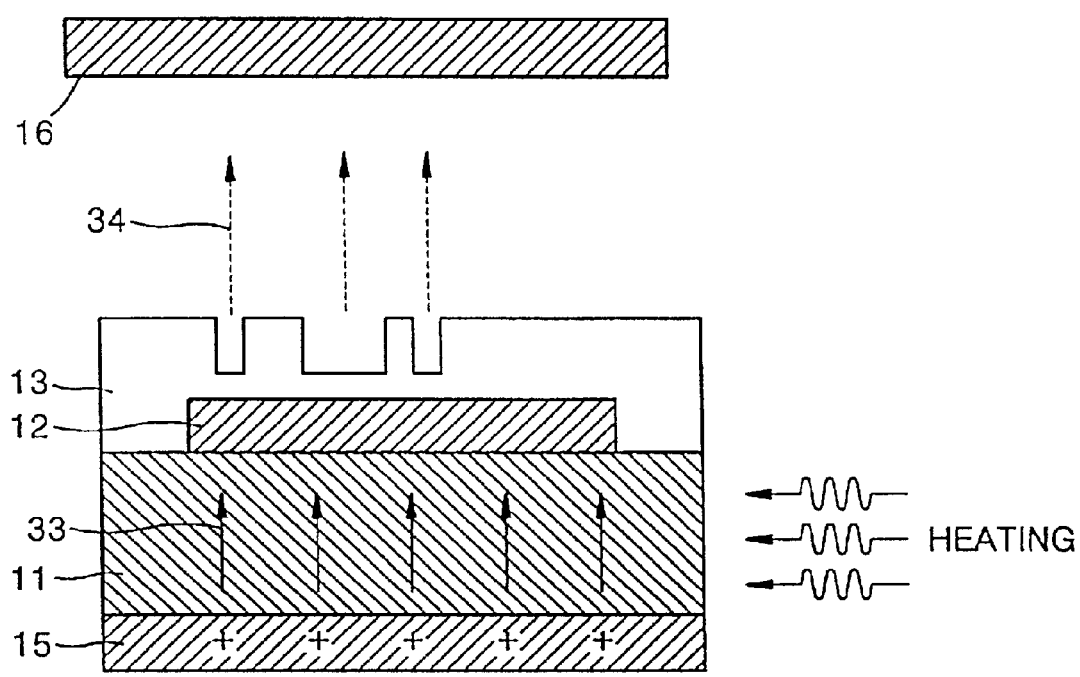
FIG. 3C Is a cross-sectional view showing an emission step in which a negative voltage is applied to the ferroelectric emitter for pyroelectric emission lithography, which is subjected to the screening step shown in FIG. 3B, and to which the dummy upper electrode is attached.

Referring to FIG. 3C, a pyroelectric emission lithography process according to the present invention will now be described. After going through the switching step, a ferroelectric layer 11 of the emitter is heated using an external heat source. The external heat source may be a heater, laser or infrared rays. When subjected to a heating step, the temperature of the ferroelectric layer 11 of the emitter goes up, reducing polarization 33. In this case, electrons 34 are emitted from the dielectric layer 13 in proportion to the reduction of polarization, to the collector 16. Through this process, electrons can be emitted by performing a heating step instead of applying a voltage in emission lithography by switching.

Figure 4:
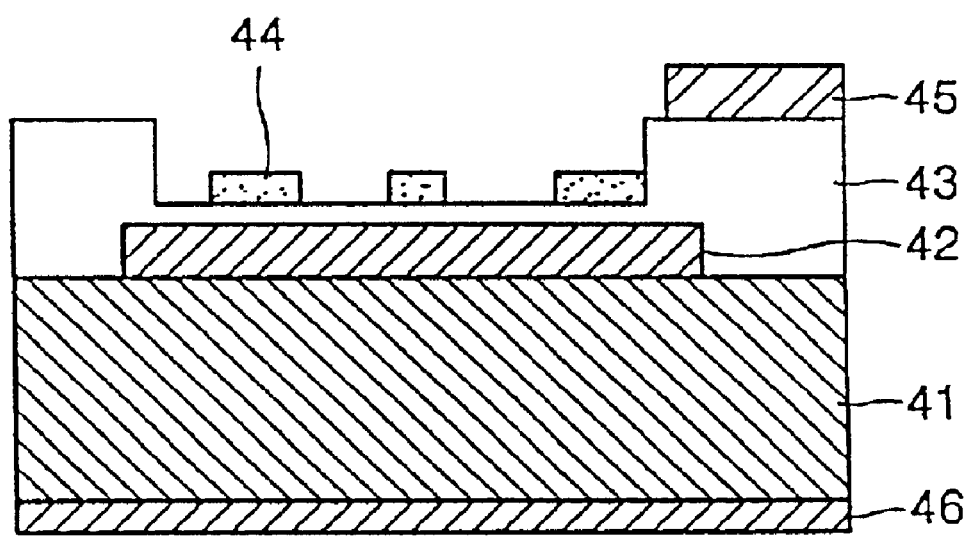
FIG. 4 is a cross-sectional view showing the structure of a ferroelectric emitter according to another preferred embodiment of present invention.

A ferroelectric emitter according to another embodiment of the invention will now be described with reference to FIG. 4. The ferroelectric emitter of FIG. 4 is different from the ferroelectric emitter of FIG. 1 in that the material of the patterned portion (second dielectric layer) differs from the material of a first dielectric layer.

An insertion electrode 42 is formed along a center portion of a top surface of a ferroelectric layer 41. Along the top surface of the ferroelectric layer 41 and the insertion electrode 42 is formed a first dielectric layer 43, the edges of which are projected. Thus, a top surface and two sides of the insertion electrode 42 are surrounded by the first dielectric layer 43. The first dielectric layer 43 is formed along the top surface of the ferroelectric layer 41 and the insertion electrode 42. Thus, a portion overlying the ferroelectric layer is thicker than a portion overlying the insertion electrode 42. A second dielectric layer 44 having a predetermined pattern is formed on a portion excluding the projected edges of the first dielectric layer 43. A lower electrode 46 underlies the ferroelectric layer 41.

The dielectric constant of the first dielectric layer 43 is different from that of the second dielectric layer 44. In the present invention, it is preferable that the dielectric constant of the former is higher than the dielectric constant of the latter. A dummy upper electrode 45 is formed on one projected side of the first dielectric layer 43. The dummy upper electrode 45 is readily detachable when operating the ferroelectric emitter according to another embodiment. The operating method of the ferroelectric emitter of FIG. 4 is the same as that of the ferroelectric emitter of FIG. 1. As shown in FIGS. 2A–3C, electron emission by switching and pyroelectric electron emission may be carried out in the same manner.

In the screening step, electrons are collected between patterns of the second dielectric layer 44, which is formed along the top surface, excluding the projected edges, of the first dielectric layer 43. The electrons are emitted during electron emission by switching or pyroelectric emission.

The present invention guarantees uniform emission of electrons from a wide or narrow region and in an isolated pattern such as a doughnut shape for ferroelectric emission lithography, while facilitating re-poling in pyroelectric emission. Accordingly, the present invention provides a ferroelectric emitter having many applications.

What is claimed is:

1. A ferroelectric emitter, comprising:
   a lower electrode;
   a ferroelectric layer, having a top surface with two end portions, overlies the lower electrode;
   an insertion electrode formed on a region excluding the two end portions of the top surface of the ferroelectric layer;
   a dielectric layer having a predetermined pattern is formed along the top surface of the ferroelectric layer and the insertion electrode to encapsulate the insertion electrode; and
   a dummy upper electrode formed on a side of the dielectric layer opposite the ferroelectric layer.

2. The ferroelectric emitter as claimed in claim 1, wherein the dielectric layer has a top surface with two end portions and the predetermined pattern is formed along the top surface of the dielectric layer excluding the two end portions.

3. The ferroelectric emitter as claimed in claim 1, wherein the dummy upper electrode is separable from the dielectric layer.

4. The ferroelectric emitter as claimed in claim 1, wherein the dummy upper electrode is formed on a region of the dielectric layer excluding the patterned portion thereof.

5. A ferroelectric emitter, comprising:
   a lower electrode;
   a ferroelectric layer, having a top surface with two end portions, overlies the lower electrode;
   an insertion electrode formed on a region excluding the two end portions of the top surface of the ferroelectric layer;
   a first dielectric layer having side edges and a top surface is formed along the top surface of the ferroelectric layer and the insertion electrode to encapsulate the insertion electrode, the side edges being projected;
   a second dielectric layer formed along the top surface of the first dielectric layer excluding the projected edges; and
   a dummy upper electrode formed on one projected side of the first dielectric layer.

6. The ferroelectric emitter as claimed in claim 5, wherein a dielectric constant of the first dielectric layer is higher than a dielectric constant of the second dielectric layer.

7. The ferroelectric emitter as claimed in claim 5, wherein the dummy upper electrode is separable from the first dielectric layer.

* * * * *

UNITED STATES PATENT AND TRADEMARK OFFICE
CERTIFICATE OF CORRECTION

PATENT NO. : 6,885,138 B1  
APPLICATION NO. : 09/665122  
DATED : April 26, 2005  
INVENTOR(S) : In-Kyeong Yoo Page 1 of 1

It is certified that error appears in the above-identified patent and that said Letters Patent is hereby corrected as shown below:

Title Page:

On the face of the patent, item (73) should read:

-- (73) Assignees: Samsung Electronics Co., Ltd.,
Kyungki-do, (KR)
and
Virginia Tech Intellectual Properties, Inc.
Blacksburg, Virginia (US)

Signed and Sealed this
Thirtieth Day of October, 2012

David J. Kappos
*Director of the United States Patent and Trademark Office*